(12) United States Patent
Ma

(10) Patent No.: US 7,819,687 B2
(45) Date of Patent: Oct. 26, 2010

(54) ELECTRICAL CONNECTOR WITH FASTENING STRUCTURE

(75) Inventor: Hao-Yun Ma, Tu-cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 119 days.

(21) Appl. No.: 12/283,829

(22) Filed: Sep. 15, 2008

(65) Prior Publication Data

US 2009/0075493 A1 Mar. 19, 2009

(30) Foreign Application Priority Data

Sep. 13, 2007 (CN) .................... 2007 2 0046662

(51) Int. Cl.
*H01R 13/62* (2006.01)
(52) U.S. Cl. ..................................... 439/331
(58) Field of Classification Search ............... 439/331, 439/73, 71
See application file for complete search history.

(56) References Cited

U.S. PATENT DOCUMENTS

| 7,160,130 | B2 * | 1/2007 | Ma ............................ 439/331 |
| 7,227,761 | B2 * | 6/2007 | Estes et al. ................... 361/810 |
| 7,402,065 | B1 * | 7/2008 | Polnyi ......................... 439/331 |
| 7,553,178 | B1 * | 6/2009 | Wertz et al. ................. 439/331 |
| 7,628,651 | B2 * | 12/2009 | Yeh ........................ 439/607.37 |
| 2006/0141840 | A1 * | 6/2006 | Ma ............................ 439/331 |

* cited by examiner

*Primary Examiner*—Gary F. Paumen
(74) *Attorney, Agent, or Firm*—Andrew C. Cheng; Wei Te Chung; Ming Chieh Chang

(57) ABSTRACT

An electrical connector (100) comprises an insulative housing (30) having a plurality of terminals receiving therein; a stiffener (50) surrounding the insulative housing (30); a clip (60) and a lever (70) pivotally assembled to the stiffener (50). The stiffener (50) comprises a main portion (502) defining an opening (503) for receiving the insulative housing (30) and some through holes (516) at corners thereof. The electrical connector (100) further comprises a plurality of gaskets (80) retained on a peripheres of the through holes (516) of the stiffener (50).

19 Claims, 5 Drawing Sheets

ELECTRICAL CONNECTOR WITH FASTENING STRUCTURE

BACKGROUND OF THE INVENTION

1. Field of the Invention

The present invention relates to the art of electrical connectors with fastening structures, and more particularly to an electrical connector with a fastening structure provided for mechanically and electrically connecting a chip module to a printed circuit board (PCB).

2. Description of the Prior Art

Electrical connectors are widely used in the connector industry for electrically connecting a chip module to a printed circuit board (PCB) in personal computer. Conventionally, an LGA electrical connector mainly comprises an insulative housing, a multiplicity of terminals received therein, a metal stiffener surrounded the insulative housing, a load plate pivotably attached to one end of the metal stiffener for pressing the chip module and a lever pivotably attached to an opposite end of the metal stiffener for buttoning the load plate on the metal stiffener. The LGA electrical connector further includes four washers assembled on the four corners of the metal stiffener.

The stiffener is substantially rectangular and comprises a base and a front sidewall extending upwardly from the base for securing the load plate and a back sidewall also extending upwardly from the base for connecting the lever and a pair of lateral sides upwardly extending from the opposed lateral edges of the base and located between the front sidewall and the back sidewall. The stiffener further defines four circular through holes at the corner of the base for retaining the four washers.

Each washer includes a main portion defining a circular center hole in the middle thereof and a multiplicity of snapped portions extending at a same direction from the inner side of the center hole and a groove formed between each two snapped portions.

When the electrical connector is assembled on the printed circuit board, the stiffener is always need some fastening members such as bolts to be located on the printed circuit board (PCB). And each said through hole at the four corners of the stiffener is not only for receiving the fastening member but also for securing the washer. The snapped portions of washers are received in and retained to said through hole of the stiffener. Thus the diameter of the through hole is need to be larger and the diameter of a head of the bolt becomes much larger correspondingly. If not, the bolt may loose its locating function. So the diameter of the bolt in conventional electrical connector has a limitation on smallest diameter, so the choice of bolt becomes narrow.

Thus, there is a need to provide an improved electrical connector that overcomes the above-mentioned problems.

SUMMARY OF THE INVENTION

Accordingly, an object of the present invention is to provide an electrical connector with a fastening structure, which is able to expand a choice of a retaining member for securing the electrical connector on a printed circuit board (PCB) and provides a stable and reliable mechanical and electrical connection between a chip module and the printed circuit board (PCB).

To fulfill the above-mentioned object, an improved electrical connector is provided to resolve the disadvantages described above. The electrical connector comprises an insulative housing having a plurality of terminals receiving therein; a stiffener surrounding the insulative housing; a clip and a lever pivotally assembled to the stiffener. The stiffener comprises a main portion and the main portion defines an opening for receiving an insulative housing and some through holes at the corner thereof. A plurality of gaskets retained on a periphery of the through holes of the stiffener and no room of the through hole being occupied by the gasket.

Other objects, advantages and novel features of the present invention will become more apparent from the following description when taken in conjunction with the accompanying drawings, in which:

DESCRIPTION OF PREFERRED EMBODIMENT OF THE INVENTION

Reference will now be made to the drawings to describe the present invention in description.

Figure 1:
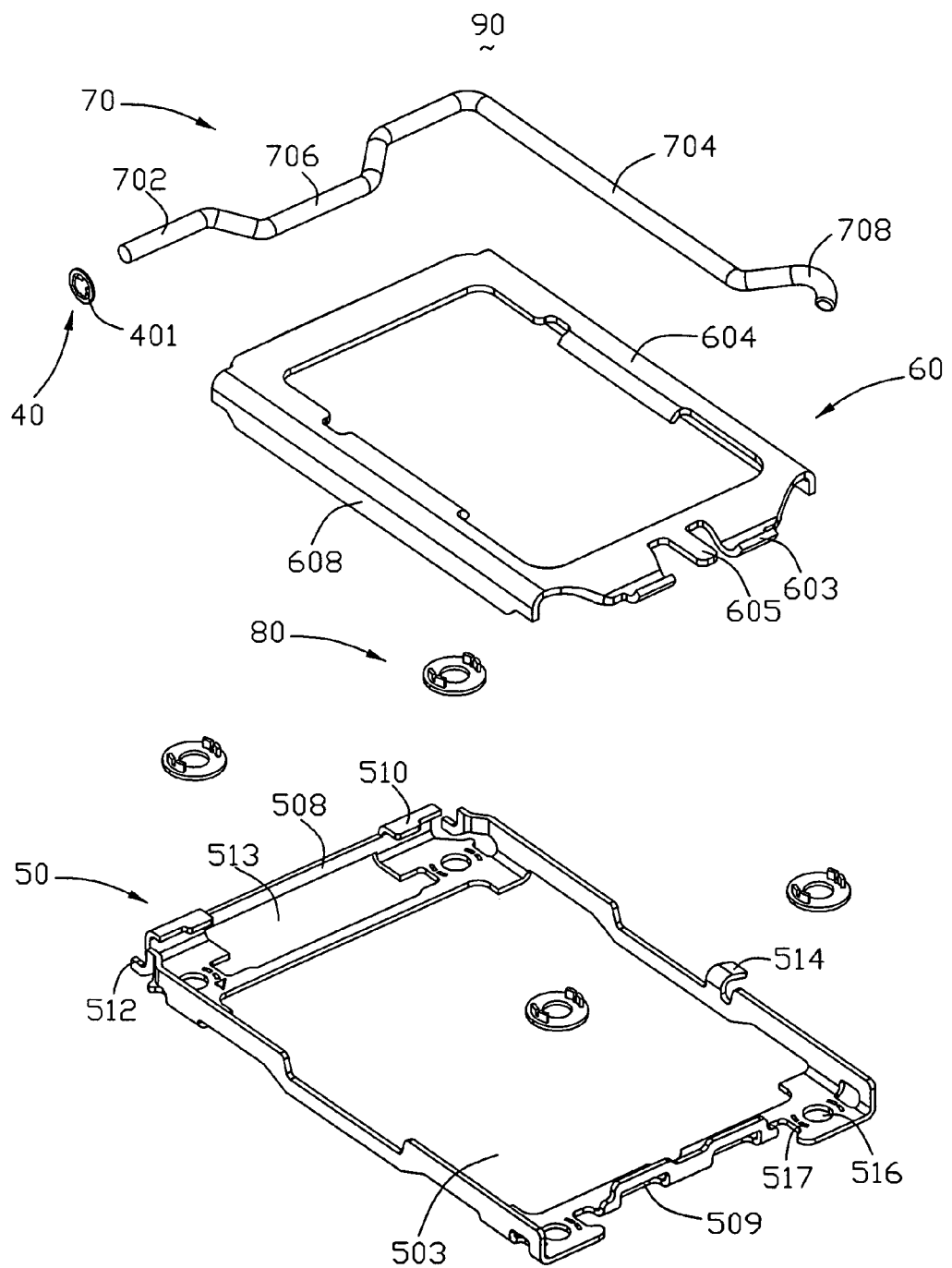
FIG. 1 is an exploded, isometric view of a fastening structure in accordance with a preferred embodiment of the present invention.
Figure 2:
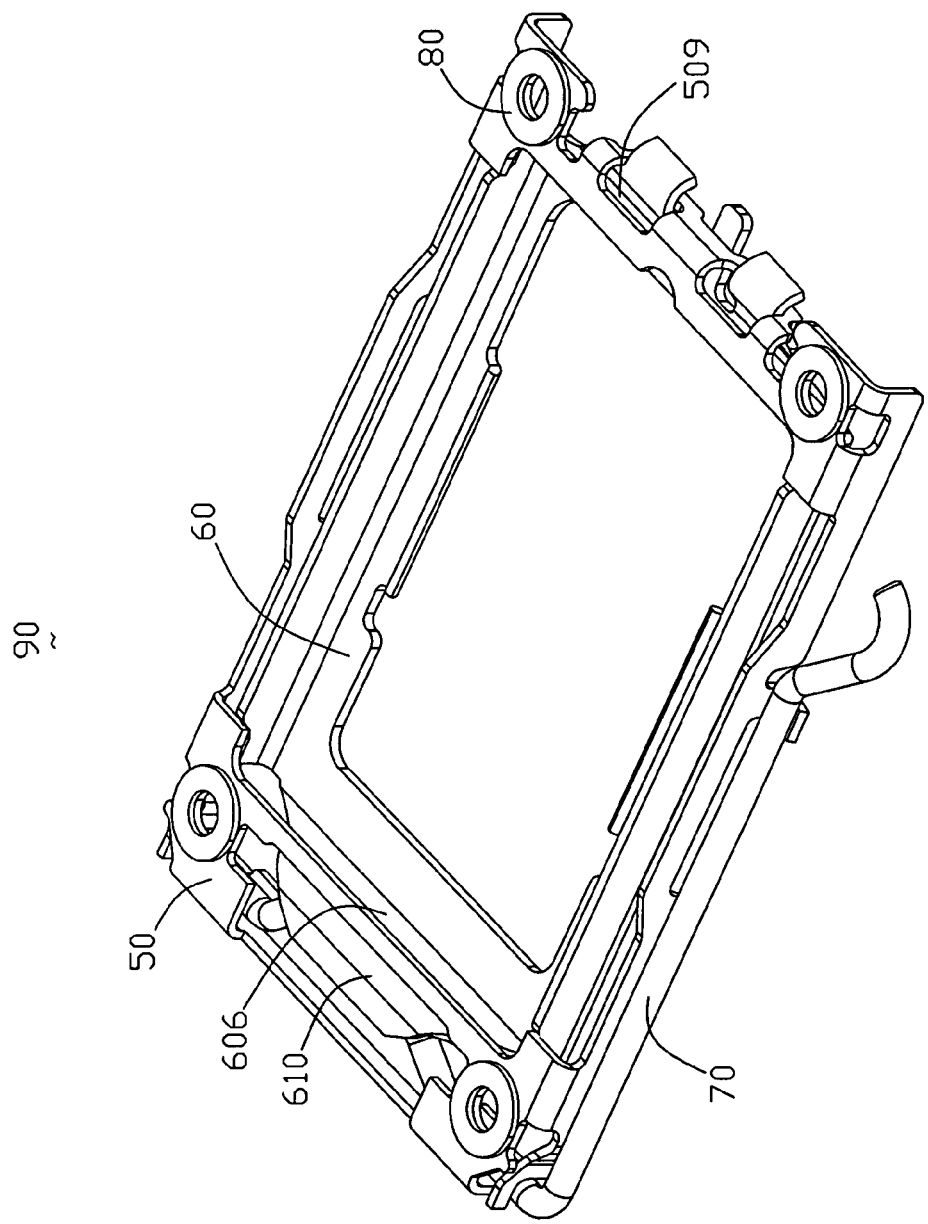
FIG. 2 is an assembled, isometric view of the fastening structure shown in FIG. 1.
Figure 3:
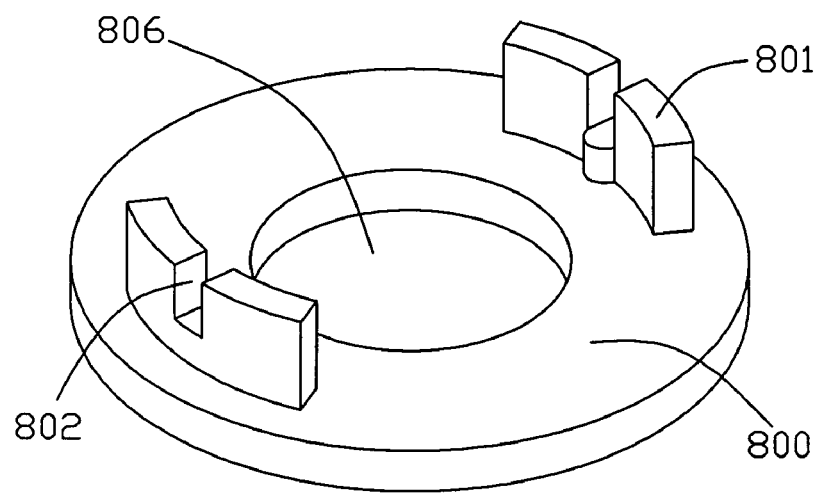
FIG. 3 is an isometric view of the retaining member of the fastening structure shown in FIG. 1.

Referring to FIGS. 1-3, a fastening structure 90 in accordance with a preferred embodiment of the present invention is disclosed. The fastening structure 90 is adapted for a stable and reliable connecting a chip module (not shown) to a printed circuit board (not shown). The fastening structure 90 includes a metal stiffener 50 assembled on the printed circuit board (not shown), a metal clip 60 pivotably mounted to an end of the stiffener 50 for pressing the chip module (not shown), a lever 70 pivotably attached to an opposite end of the stiffener 50 for engaging with the metal clip 60, and some gaskets 80 retained on the stiffener 50.

Figure 4:
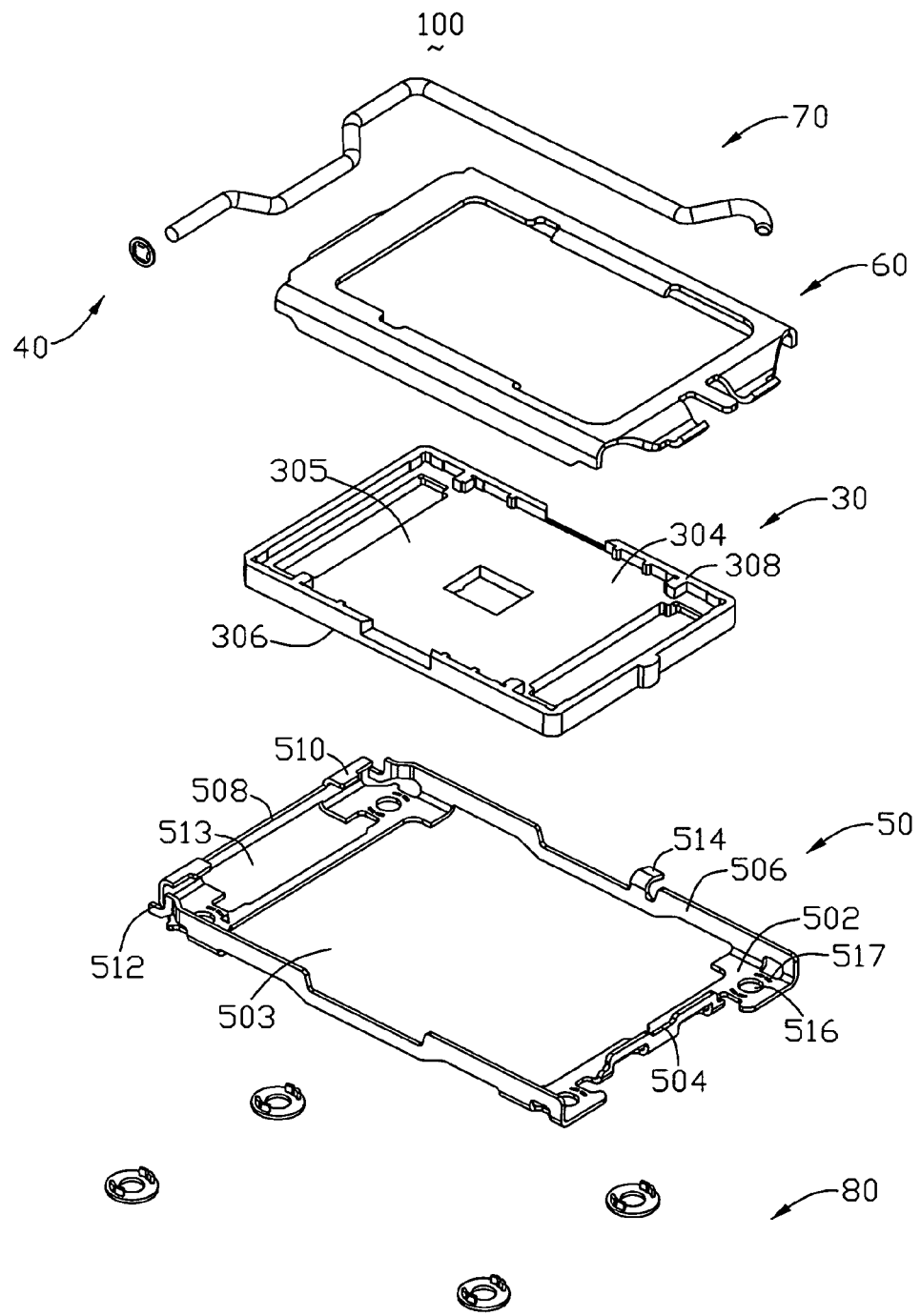
FIG. 4 is an exploded, isometric view of an electrical connector with the fastening structure shown in FIG. 1 in accordance with a preferred embodiment of the present invention.
Figure 5:
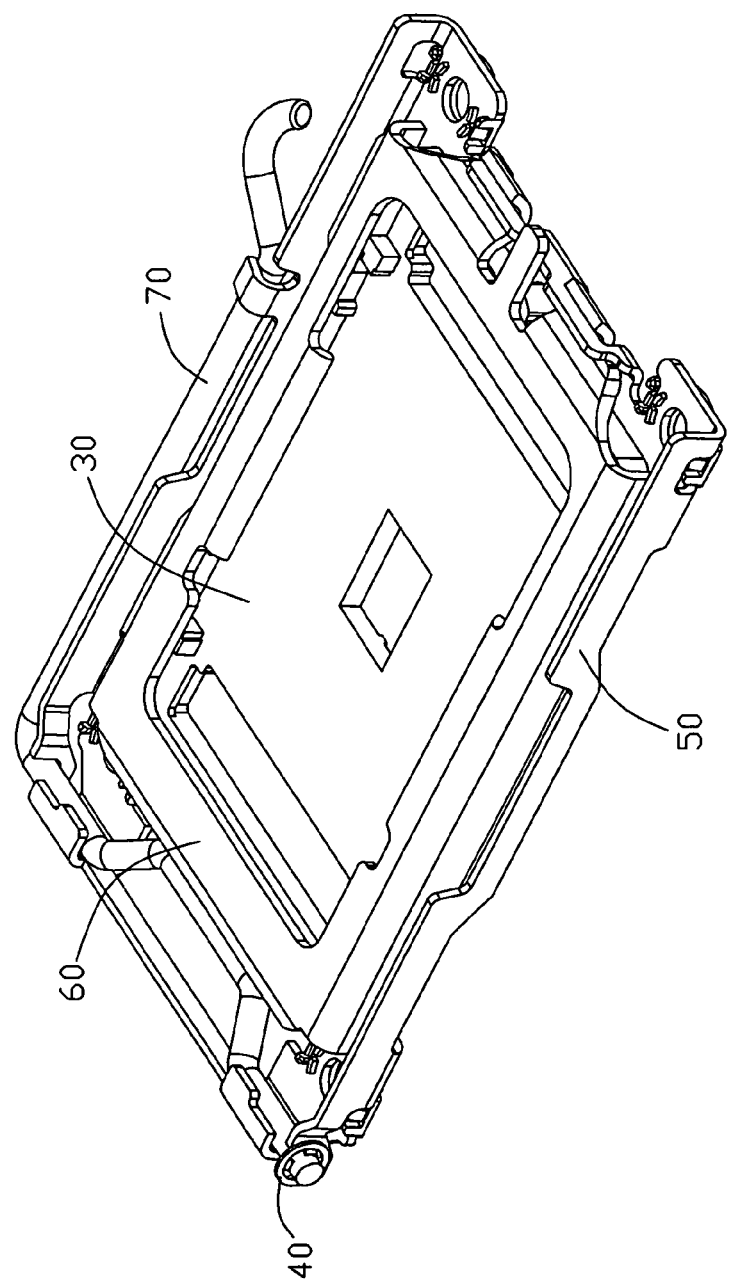
FIG. 5 is an assembled view of the electrical connector shown in FIG. 4.

Referring to FIGS. 4-5, showing an electrical connector 100 with said fastening structure 90 in accordance with a preferred embodiment of the present invention. The electrical connector 100 is adapted for electrically connecting a chip module (not shown) to the printed circuit board (not shown) and includes an insulative housing 30 assembled with a multiplicity of terminals (not shown) and the fastening structure 90 surrounding the insulative housing 30.

Referring to FIG. 4, the insulative housing 30 has a generally rectangular shape, and includes a base 304 and four sidewalls 308 extending upwardly from the base 304. The base 304 and the sidewalls 308 cooperatively define a generally rectangular cavity (not labeled) in a middle section thereof for receiving the chip module (not shown) therein. The base 304 defines a mating interface 305 for supporting the chip module (not shown), and a mounting interface 306 opposite to the mating interface 305, a plurality through slots (not shown) extending between the mating interface 305 and the mounting interface 306 for receiving the terminals (not shown) therein respectively. A plurality of terminals (not shown) each is securely positioned into corresponding through slots (not shown). Each terminal (not shown) includes a contact engaging portion (not shown) extending beyond the mating interface 305, and a soldering portion (not shown) extending beyond the mounting interface 306 connecting a solder ball (not shown) for jointing the terminal (not shown) on the printed circuit board (not shown).

Referring to FIG. 1 and FIG. 4, the stiffener 50 is substantially rectangular and comprises a main portion 502, a front sidewall 504 extending upwardly from one end of the main portion 502 for attaching the metal clip 60, a back sidewall 508 extending upwardly from an opposite end of the main portion 502 for attaching the level 70, and a pair of parallel lateral sides 506 extending upwardly and connecting the front sidewall 504 and the back sidewall 508. The main portion 502 defines an opening 503 in the middle thereof for receiving the insulative housing 30 and a receiving recess 513 adjacent to the back sidewall 508 for receiving a part portion of the clip 60 therein. The front sidewall 504 defines a pair of separate retaining grooves 509 for connecting the clip 60. The back sidewall 508 includes a pair of U-shaped cross-section 510 extending toward the receiving recess 513. Each lateral side 506 defines a substantially L-shaped stopper wall 512 extending toward the back sidewall 508. One of the lateral side 506 defines a locking hook 514 for engaging with lever 70. In additionally, the main portion 502 further defines four circular through holes 516 at the corner of the stiffener 50 and a plurality of securing holes 517 around the through holes 516. In common, the securing holes 517 are symmetrically located on two sides of each through hole 516 for retaining the gaskets 80.

Referring to FIG. 1 and FIG. 3, each gasket 80 is buttoned in the securing holes 517 of the stiffener 50 and includes a circular flat base portion 800 and some retaining portions 801 extending upwardly from one side of the base portion 800. The fastening members 801 are defined in couples and a gap 802 is formed between each couple retaining portions 801. The gap 802 can increase an elasticity of the retaining portions 801 and avoid rupturing of the root of the retaining portions 801. The base portion 800 defines a center hole 806 in the middle thereof. The center hole 806 is run-through and aligned with the through hole 516 at the corner of the stiffener 50.

Referring to FIG. 1 and FIG. 4, the lever 70 includes a connecting portion 704, a pair of locating portions 702 pivotably received in the chambers 510 of the stiffener 50, an offset actuating portion 706 between the locating portions 702, and an operating portion 708 extending upwardly and frontwardly from an end of the locating portions 702 and bent far away from the housing 30. The operating portion 708 is disposed outside of the stiffener 50. When oriented at a horizontal position, the operating portion 708 engages with the locking hook 514 on the stiffener 50.

Referring to FIG. 1, the clip 60 has a first side (not labeled), a second side 606 opposite to the first side (not labeled) and two opposite third slant sides 604 connecting the first side (not labeled) and the second side 606 respectively. The first side (not labeled), the second side 606 and third sides 604 cooperatively form a hollow receiving space (not labeled). A pair of spaced securing portions 603 extend arcuately from the first side (not labeled) thereof and are pivotably received in the retaining grooves 509 of the stiffener 50, and a stopper 605 is formed between the securing portions 603 for abutting against the stiffener 50 to prevent the clip 60 from being over-rotated. The second side 606 defines a pressing portion 610 extending arcuately from an outside of the second side 606 thereof for engaging with the offset actuating portion 706 of the lever 70 therein. The third sides 604 are bent to form current portions 608 toward the housing 30 and each of the third sides 604 defines a pressing portion (not labeled) extending from inner side thereof and bent toward the housing 30 in a middle portion thereof.

Referring to FIG. 1, a circular holding ring 40 defines some fixing patches 401 at an inner side thereof.

Referring to FIGS. 1-5, in assembly of the electrical connector 100, the clip 60 and the lever 70 are respectively attached to the front sidewall 504 and the back sidewall 508 of the stiffener 50. Then rotate the clip 60 and the lever 70 away from the stiffener 50 in an open position, the insulative housing 30 assembled with a plurality of terminals (not shown) is installed in the opening 503 in the middle of the stiffener 50. The gaskets 80 are retained in the securing holes 517 of the stiffener 50 by the retaining portions 801. The holding ring 40 is assembled on the free end of the locating portions 702 and located outside of the stiffener 50 and the lever 70 is received and rotatably retained in the chambers 510 of the stiffener 50. Simultaneously, some fastening members (not shown) are inserted in the through holes 516 at the corner of the stiffener 50 and thus the electrical connector 100 is fixed on the printed circuit board (not shown).

When the electrical connector 100 is assembled on the printed circuit board (not shown), make the clip 60 and the level 70 in the open position and put the chip module (not shown) on to the insulative housing 30. Then push down the clip 60 and the pressing portion 610 is received in the receiving recess 513 of the stiffener 50. Finally, rotate the level 70 until the connecting portion 704 is locked on the locking hook 514 of the stiffener 50. When the electrical connector 100 is in a closed position, the offset actuating portion 706 of the lever 70 is engaged with the pressing portion 610 of the clip 60. So, it realizes an electrical connection between the chip module (not shown) and the electrical connector 100.

In the present invention, the retaining portions 801 of the gaskets 80 are inserted in the securing holes 517 of the stiffener 50 so as to fasten the gaskets 80 on the bottom of the stiffener 50. Thus, the four circular through holes 516 at the corners of the stiffener 50 are only for receiving the fastening members (not shown) and there is no need to provide room for retaining the gaskets 80. And the diameter of the through holes 516 of the stiffener 50 could be cut short and broaden the choice of the fastening member.

In this preferred embodiment of the present invention, the retaining portions 801 are extending upwardly toward the securing holes 517 of the main portion 502 of the stiffener 50. In fact, some retaining portions are also extending downwardly toward the main portion 502 of the stiffener 50 and the securing holes are defined on the base portion 800 of the gaskets 80. Thus this design also can fasten the gaskets 80 on the stiffener 50. In a word, the gaskets 80 are not need to be fixed in the through holes 516 of the stiffener 50 and thus save the room of the through holes 516 so as to meet the need of broadening the choice of the fastening member.

Although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. A fastening structure for connecting a chip module with a printed circuit board, including:
   a stiffener being able to assemble on the printed circuit board, the stiffener comprising a main portion defining an opening for receiving an insulative housing and some through holes at the corners thereof;

a clip and a lever pivotably assembled to the stiffener; and a plurality of gaskets retained on peripheries of the through holes of the stiffener, and no room of the through hole being occupied by the gasket.

2. The fastening structure as claimed in claim 1, wherein at least one of the stiffener and the gasket defines retaining portions, and the other defines a plurality of securing holes receiving and retaining the retaining portions.

3. The fastening structure as claimed in claim 2, wherein each gasket includes a base portion, and the retaining portions extend upwardly from the base portion.

4. The fastening structure as claimed in claim 3, wherein the retaining portions are defined in couples on one side of the base portion, and a gap is formed between each couple of retaining portions.

5. The fastening structure as claimed in claim 3, wherein the base portion of the gasket further defines a center hole in a middle thereof and the center hole is run-through and aligns with the through hole at the corner of the stiffener.

6. The fastening structure as claimed in claim 3, wherein the main portion of the stiffener further defines some securing holes around the through holes for retaining the retaining portions of the gaskets.

7. The fastening structure as claimed in claim 6, wherein the securing holes are symmetrically defined on two sides of the through holes.

8. The fastening structure as claimed in claim 1, wherein the clip is pivotally assembled to one end of the stiffener, and the lever is pivotally assembled to an opposite end of the stiffener.

9. An electrical connector, for electrically connecting a chip module to a printed circuit board, comprising:

an insulative housing having a plurality of terminals received therein;

a stiffener surrounding the insulative housing and comprising a main portion which defines an opening for receiving the insulative housing and some through holes at corners thereof;

a clip and a lever pivotally assembled to the stiffener; wherein the electrical connector further comprises a plurality of gaskets retained outside of the peripheries of the respective through holes of the stiffener.

10. The electrical connector as claimed in claim 9, wherein each gasket includes a base portion and some retaining portions extending upwardly from the base portion.

11. The electrical connector as claimed in claim 10, wherein the main portion of the stiffener further defines some securing holes around the through holes for retaining the retaining portions of the gaskets.

12. The electrical connector as claimed in claim 9, wherein the retaining portions are defined in couples on one side of the base portion in couples, and a gap is formed between the couple of retaining portions.

13. The electrical connector as claimed in claim 9, wherein the base portion of each gasket further defines a center hole in the middle thereof and the center hole is run-through and align with each through hole at the corner of the stiffener.

14. An electrical connector assembly comprising:

an insulative housing defining an upward facing receiving cavity;

a plurality of contacts disposed in the housing with contacting sections upwardly extending into the receiving cavity;

a metallic stiffener at least partially surrounding the housing and equipped with a clip covering the receiving cavity for holding an electronic package in the housing;

at least a first through hole defined in the stiffener; and a gasket intimately positioned below the stiffener around the through hole and defining a second through hole in vertical alignment with the first through hole; wherein the gasket is equipped with at least one retention portion retainably engaged with the stiffener under a condition that said retention portion is spaced away from and not involved with the first through hole independently.

15. The electrical connector assembly as claimed in claim 14, wherein no portions of the stiffener is located below a bottom surface of the gasket, and the gasket is tightly sandwiched between the stiffener and a printed circuit board on which the contacts are soldered.

16. The electrical connector assembly as claimed in claim 14, wherein said retention portion extends upward to be latchably engaged within a corresponding securing hole in the stiffener which is isolated from the first through hole laterally.

17. The electrical connector assembly as claimed in claim 14, wherein said retention portion extends upward and is isolated from the second through hole laterally.

18. The electrical connector assembly as claimed in claim 14, wherein said clip is pivotally assembled to the stiffener.

19. The electrical connector assembly as claimed in claim 18, wherein said stiffener is further equipped with a lever pivotally assemble thereto to downwardly press the clip.

* * * * *